US010050099B2

(12) United States Patent
Kim et al.

(10) Patent No.: US 10,050,099 B2
(45) Date of Patent: Aug. 14, 2018

(54) ORGANIC LIGHT-EMITTING DIODE DISPLAY INCLUDING UPPER INSULATION LAYER AND LOWER INSULATION LAYER HAVING DIFFERENT REFRACTIVE INDEXS

(71) Applicant: Samsung Display Co., Ltd., Yongin-si, Gyeonggi-do (KR)

(72) Inventors: Sunkwang Kim, Yongin-si (KR); Kwangsuk Kim, Yongin-si (KR); Kinyeng Kang, Yongin-si (KR); Heejun Yoo, Yongin-si (KR); Jonghyun Choi, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/261,778

(22) Filed: Sep. 9, 2016

(65) Prior Publication Data
US 2017/0077209 A1    Mar. 16, 2017

(30) Foreign Application Priority Data

Sep. 11, 2015 (KR) .......................... 10-2015-0129091

(51) Int. Cl.
*H01L 27/32* (2006.01)
(52) U.S. Cl.
CPC ........ *H01L 27/3276* (2013.01); *H01L 27/326* (2013.01); *H01L 27/3246* (2013.01); *H01L 27/3258* (2013.01); *H01L 27/3262* (2013.01)
(58) Field of Classification Search
CPC ............. H01L 27/3276; H01L 27/3246; H01L 27/3258; H01L 27/3262; H01L 51/56; H01L 27/3248; H01L 2227/323
See application file for complete search history.

(56) References Cited

U.S. PATENT DOCUMENTS

| 2011/0169720 | A1 | 7/2011 | Hwang et al. |
| 2012/0153286 | A1 | 6/2012 | Yoon et al. |
| 2015/0014650 | A1 | 1/2015 | Lim et al. |
| 2016/0141351 | A1* | 5/2016 | You ..................... H01L 27/3276 |
| | | | 257/40 |

FOREIGN PATENT DOCUMENTS

| KR | 10-2002-0095997 A | 12/2002 |
| KR | 10-2011-0081629 A | 7/2011 |
| KR | 10-2012-0069395 A | 6/2012 |
| KR | 10-2013-0112168 A | 10/2013 |

* cited by examiner

*Primary Examiner* — Thanh T Nguyen
(74) *Attorney, Agent, or Firm* — Knobbe, Martens, Olson & Bear, LLP

(57) ABSTRACT

An organic light-emitting diode (OLED) display and a method of manufacturing the same are disclosed. In one aspect, the OLED display includes a pixel disposed over a substrate, the pixel including a first region configured to generate an image and a second region configured to transmit external light. The pixel also includes a first transistor including a first active layer disposed in the first region, a first gate electrode disposed over the first active layer and insulated from the first active layer, and at least one electrode pattern disposed over the first gate electrode and electrically connected to the first active layer. A first insulation layer is disposed between the first gate electrode and the electrode pattern, the first insulation layer including a lower insulation layer and an upper insulation layer disposed over the lower insulation layer.

13 Claims, 13 Drawing Sheets

ORGANIC LIGHT-EMITTING DIODE DISPLAY INCLUDING UPPER INSULATION LAYER AND LOWER INSULATION LAYER HAVING DIFFERENT REFRACTIVE INDEXS

CROSS-REFERENCE TO RELATED APPLICATION

This application claims the benefit of Korean Patent Application No. 10-2015-0129091, filed on Sep. 11, 2015, in the Korean Intellectual Property Office, the disclosure of which is incorporated herein in its entirety by reference.

BACKGROUND

Field

The described technology generally relates to an organic light-emitting diode (OLED) display and a method of manufacturing the same.

Description of the Related Technology

In OLED display technology, each pixel circuit includes an OLED, includes a hole injection electrode, an electron injection electrode, and an interposed organic emission layer. Holes injected from the hole injection electrode and electrons injected from the electron injection electrode combine in the organic emission layer, thereby generating excitons, and when the excitons decay from an excited state to a ground state, light is emitted.

Since an OLED display is self-emissive and does not require a separate light source, it can be driven with a low voltage and is lightweight and thin. Also, as OLED technology has other desirable characteristics such as a wide viewing angle, high contrast, rapid response rate, the range of its commercial application is broad from personal portable devices, such as MP3 players and portable terminals, to televisions (TVs).

A transparent OLED display which enables a user to recognize an external background as well as a generated image is the subject of considerable research activity.

SUMMARY OF CERTAIN INVENTIVE ASPECTS

One inventive aspect relates to a transparent OLED display and a method of manufacturing the same, which enable a user to recognize an external background as well as an image realized by the organic light-emitting diode display.

Another aspect is an OLED display with enhanced transmittance and a method of manufacturing an OLED display through a simple process without a mask being added.

Another aspect is an OLED display that includes: a substrate including a main surface; and a pixel disposed on the main surface of the substrate, the pixel including a first region realizing an image and a second region through which external light is transmitted, wherein the pixel includes: a first transistor including a first active layer disposed in the first region, a first gate electrode disposed on the first active layer to be insulated from the first active layer, and at least one electrode pattern disposed on the first gate electrode and electrically connected to the first active layer; a first insulation layer disposed between the first gate electrode and the electrode pattern, the first insulation layer including a lower insulation layer and an upper insulation layer which is disposed on the lower insulation layer to correspond to the at least one electrode pattern and has a refractive index different from a refractive index of the lower insulation layer; a first electrode disposed in the first region to be electrically connected to the first transistor; a pixel defining layer disposed in the first region, the pixel defining layer including a first opening exposing a portion of the first electrode and a second opening corresponding to the second region; a second electrode opposite to the first electrode; and an intermediate layer disposed between the first electrode and the second electrode, the intermediate layer including an organic emission layer.

The first active layer may include a source region, a drain region spaced apart from the source region, and a channel region disposed between the source region and the drain region, the at least one conductive pattern may include a source electrode and a drain electrode electrically connected to the source region and the drain region, respectively, and spaced apart from each other, and the upper insulation layer may include an opening corresponding to a region between the source electrode and the drain electrode.

The OLED display may further include: a via insulation layer disposed between the first transistor and the first electrode, the via insulation layer including an opening corresponding to the second region.

The first region may include a region that is adjacent to the first transistor and directly contacts the lower insulation layer and the via insulation layer.

The at least one conductive pattern may include a titanium (Ti) layer, an aluminum (Al) layer, and a Ti layer which are sequentially arranged.

The OLED display may further include: a data line disposed adjacent to the second region, wherein the lower insulation layer may extend to a bottom of the data line, and the upper insulation layer may be disposed on the lower insulation layer to correspond to the data line.

The data line may be provided in plurality, the data lines being disposed adjacent to each other. The upper insulation layer may include an opening disposed between the data lines.

The lower insulation layer may include silicon oxide, and the upper insulation layer may include silicon nitride.

The OLED display may further include: a second transistor electrically connected to the first transistor; and a capacitor electrically connected to the second transistor and disposed to overlap the second transistor along a direction vertical to the main surface of the substrate, wherein the second transistor may include a second active layer and a second gate electrode insulated from the second active layer, and the capacitor may include the second gate electrode configured to function as a lower electrode and an upper electrode disposed on a layer different from a layer, on which the at least one conductive pattern is disposed, to be opposite to the second gate electrode.

The OLED display may further include: a second insulation layer disposed between the second gate electrode and the upper electrode to correspond to the upper electrode.

An area of the upper electrode may be larger than an area of the second gate electrode.

The second insulation layer may include silicon nitride.

The OLED display may further include: an insulation structure disposed in the second region on the substrate, the insulation structure including a plurality of insulation layers, wherein the insulation layers may include insulating materials having substantially the same refractive index.

Another aspect is a method of manufacturing an OLED display, the method including: providing a substrate including a first region realizing an image and a second region through which external light is transmitted; forming a first active layer in the first region of the substrate and a first gate electrode insulated from the first active layer; forming a lower insulating material and an upper insulating material, having different refractive indexes, on the first gate electrode; forming an opening, exposing at least a portion of the first active layer, in each of the lower insulating material and the upper insulating material; performing thermal annealing; forming a conductive material on the upper insulating material; simultaneously etching the conductive material and the upper insulating material to form a first insulation layer and a conductive pattern, the first insulation layer including a lower insulation layer and an upper insulation layer disposed on the lower insulation layer, and the conductive pattern being electrically connected to the first active layer through the opening; forming a first electrode, electrically connected to the conductive pattern, in the first region on the substrate; forming a pixel defining layer in at least the first region, the pixel defining layer including a first opening exposing a portion of the first electrode and a second opening corresponding to the second region; forming an intermediate layer, including an organic emission layer, on the first electrode exposed by the first opening; and forming a second electrode on the intermediate layer.

The lower insulating material may include silicon oxide, and the upper insulating material may include silicon nitride.

The method may further include: forming a lower gate insulation layer, having substantially the same refractive index as a refractive index of the lower insulation layer, between the first active layer and the first gate electrode, wherein the lower gate insulation layer and the lower insulation layer may be formed in the first region and the second region.

The simultaneously etching the conductive material and the upper insulating material may include: forming a photoresist on the conductive material; irradiating light onto the photoresist by using a mask which includes a light blocking part blocking the light and a light transmitting part transmitting the light; removing a region corresponding to the light transmitting part of the photoresist; and simultaneously etching the conductive material, exposed by removing the photoresist, and the upper insulating material disposed under the exposed conductive material.

The etching may include dry etching.

The method may further include: forming, on the lower insulation layer, a via insulation layer covering the conductive pattern and the upper insulation layer, wherein the forming of the via insulation layer may include forming the via insulation layer for at least a portion of the via insulation layer to directly contact the lower insulation layer, in the first region.

The forming of the conductive pattern may include forming the conductive pattern including a titanium (Ti) layer, an aluminum (Al) layer, and a Ti layer which are sequentially arranged.

Another aspect is an organic light-emitting diode (OLED) display, comprising: a substrate; and a pixel disposed over the substrate, the pixel including a first region configured to generate an image and a second region configured to transmit external light. The pixel comprises: a first transistor including a first active layer disposed in the first region, a first gate electrode disposed over the first active layer and insulated from the first active layer, and at least one electrode pattern disposed over the first gate electrode and electrically connected to the first active layer; a first insulation layer disposed between the first gate electrode and the electrode pattern, the first insulation layer including a lower insulation layer and an upper insulation layer disposed over the lower insulation layer, wherein the upper insulation layer corresponds to the at least one electrode pattern and has a refractive index different from a refractive index of the lower insulation layer; a first electrode disposed in the first region and electrically connected to the first transistor; a pixel defining layer disposed in the first region and having a first opening connected to a portion of the first electrode and a second opening corresponding to the second region; a second electrode opposite to the first electrode; and an intermediate layer disposed between the first and second electrodes, wherein the intermediate layer includes an organic emission layer.

In the above OLED display, the first active layer comprises a source region, a drain region spaced apart from the source region, and a channel region disposed between the source region and the drain region, wherein the at least one conductive pattern comprises a source electrode and a drain electrode electrically connected to the source region and the drain region, respectively, and spaced apart from each other, and wherein the upper insulation layer comprises an opening corresponding to a region between the source and drain electrodes.

The above OLED display further comprises a via insulation layer disposed between the first transistor and the first electrode, the via insulation layer including an opening corresponding to the second region.

In the above OLED display, the first region comprises a region that is adjacent to the first transistor and directly contacts the lower insulation layer and the via insulation layer.

In the above OLED display, the at least one conductive pattern comprises a titanium (Ti) layer, an aluminum (Al) layer, and a Ti layer which are sequentially arranged.

The above OLED display further comprises a data line disposed adjacent to the second region, wherein the lower insulation layer extends to a bottom portion of the data line, and wherein the upper insulation layer is disposed on the lower insulation layer and corresponds to the data line.

In the above OLED display, the data line includes a plurality of data lines, wherein the data lines are disposed adjacent to one another, wherein the upper insulation layer comprises an opening disposed between the data lines.

In the above OLED display, the lower insulation layer is formed of silicon oxide, wherein the upper insulation layer is formed of silicon nitride.

The above OLED display further comprises: a second transistor electrically connected to the first transistor; and a capacitor electrically connected to the second transistor and overlapping the second transistor in the depth dimension of the OLED display, wherein the second transistor comprises a second active layer and a second gate electrode insulated from the second active layer, wherein the capacitor comprises i) the second gate electrode configured to function as a lower electrode and ii) an upper electrode opposite the second gate electrode, and wherein the upper electrode and the at least one conductive pattern are disposed on different layers.

The above OLED display further comprises a second insulation layer disposed between the second gate electrode and the upper electrode and corresponding to the upper electrode.

In the above OLED display, the upper electrode is larger in area than the second gate electrode.

In the above OLED display, the second insulation layer is formed of silicon nitride.

The above OLED display further comprises an insulation structure disposed in the second region on the substrate, wherein the insulation structure includes a plurality of insulation layers, and wherein the insulation layers are formed of insulating materials having substantially the same refractive index.

Another aspect is a method of manufacturing an organic light-emitting diode (OLED) display, the method comprising: providing a substrate including a first region configured to display an image and a second region configured to transmit external light; forming a first active layer in the first region and a first gate electrode insulated from the first active layer; forming a lower insulating material and an upper insulating material having different refractive indexes over the first gate electrode; forming an opening, exposing at least a portion of the first active layer, in each of the lower and upper insulating materials; performing thermal annealing; forming a conductive material over the upper insulating material; concurrently etching the conductive material and the upper insulating material to form a first insulation layer and a conductive pattern, wherein the first insulation layer includes a lower insulation layer and an upper insulation layer disposed over the lower insulation layer, and wherein the conductive pattern is electrically connected to the first active layer through the opening; forming a first electrode, electrically connected to the conductive pattern, in the first region on the substrate; forming a pixel defining layer in at least the first region, wherein the pixel defining layer includes a first opening exposing a portion of the first electrode and a second opening corresponding to the second region; forming an intermediate layer including an organic emission layer over the first electrode through the first opening; and forming a second electrode over the intermediate layer.

In the above method, the lower insulating material includes silicon oxide, and wherein the upper insulating material includes silicon nitride.

The above method further comprises forming a lower gate insulation layer, having substantially the same refractive index as a refractive index of the lower insulation layer, between the first active layer and the first gate electrode, wherein the lower gate insulation layer and the lower insulation layer are formed in the first and second regions.

In the above method, the etching comprises: forming a photoresist over the conductive material; irradiating light onto the photoresist with a mask which includes a light blocking region configured to block the light and a light transmitting region configured to transmit the light; removing a portion of the photoresist corresponding to the light transmitting region; and concurrently etching the conductive material, exposed by removing the photoresist, and the upper insulating material disposed under the exposed conductive material.

In the above method, the etching comprises dry etching.

The above method further comprises forming a via insulation layer covering the conductive pattern and the upper insulation layer over the lower insulation layer, wherein at least a portion of the via insulation layer directly contacts the lower insulation layer in the first region.

In the above method, the forming of the conductive pattern comprises forming the conductive pattern including a titanium (Ti) layer, an aluminum (Al) layer, and a Ti layer which are sequentially arranged.

DETAILED DESCRIPTION OF CERTAIN INVENTIVE EMBODIMENTS

Figure 1:
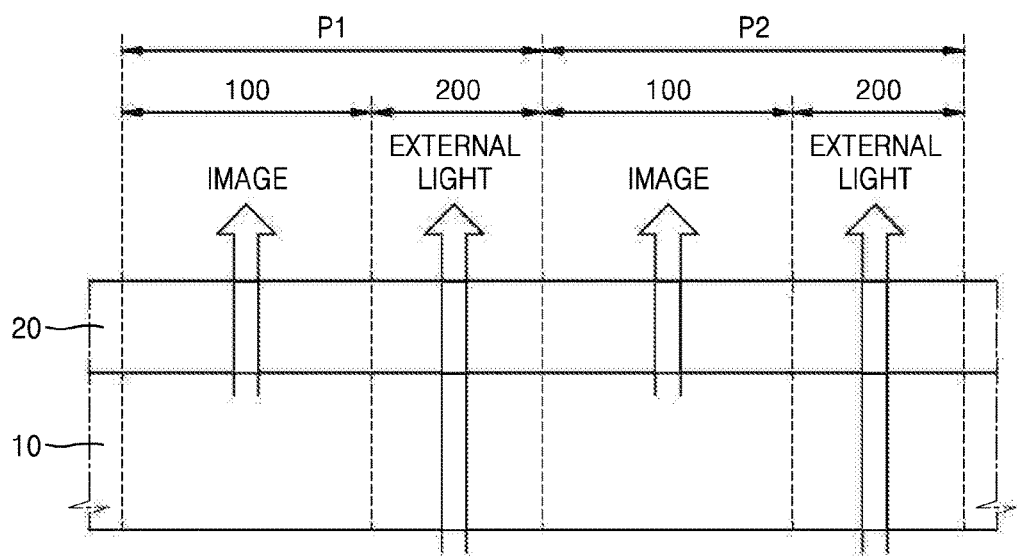
FIG. 1 is a cross-sectional view schematically illustrating an OLED display according to an exemplary embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The effects and features of the described technology will become apparent from the following description of the embodiments with reference to the accompanying drawings. The described technology may, however, may be embodied in different forms and should not be construed as being limited to the embodiments set forth herein.

Hereinafter, embodiments of the described technology will be described in detail with reference to the accompanying drawings. In the present specification and drawings, like reference numerals refer to like elements throughout.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Hereinafter, exemplary embodiments will be described in detail with reference to the accompanying drawings. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

FIG. 1 is a cross-sectional view schematically illustrating an OLED display according to an exemplary embodiment.

Referring to FIG. 1, the OLED display according to an exemplary embodiment includes a substrate 10 and a display unit 20 which is disposed on the substrate 10 and includes a plurality of pixels P1 and P2 each including a first region 100 emitting light and a second region 200 through which external light is transmitted. The external light denotes light which is incident on the OLED display from the outside of the OLED display. External light incident on one surface of the OLED display may pass through the substrate 10 and the display unit 20, may pass through the other surface opposite to the one surface of the OLED display, and may be recognized by a user.

That is, a user located on a side where an image is realized may watch an image displayed on an outer side of the substrate 10. In the exemplary embodiment of FIG. 1, a top emission type where an image displayed by the display unit 20 is realized in a direction opposite to the substrate 10, but the present embodiment is not limited thereto. That is, an OLED display according to another exemplary embodiment may have a bottom emission type, where an image displayed by the display unit 20 is realized in a direction toward the substrate 10, or a dual emission type where an image displayed by the display unit 20 is realized in a direction toward the substrate 10 and in a direction opposite to the substrate 10.

In FIG. 1, a first pixel P1 and a second pixel P2 which are two pixels adjacent to each other included in the OLED display according to an exemplary embodiment are illustrated. Each of the pixels P1 and P2 may include the first region 100 and the second region 200. An image may be realized from the first region 100 of the display unit 20, and external light may be transmitted through the second region 200. Although not shown, the second region 200 may be disposed to be connected to a plurality of pixels.

An element, including opaque metal like a thin film transistor (TFT), a capacitor, and an OLED, may not be disposed in the second region 200. Due to such a configuration, an external light transmittance of the second region 200 increases.

Figure 2:
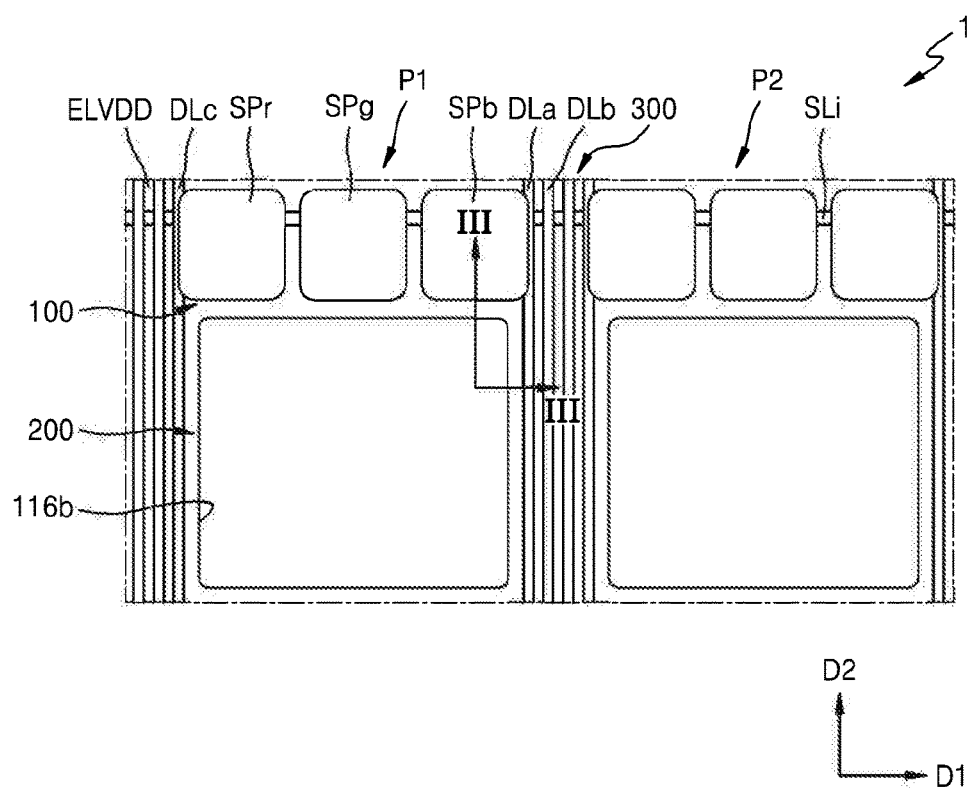
FIG. 2 is a plan view schematically illustrating a plurality of pixels included in an OLED display according to an exemplary embodiment.
Figure 3:
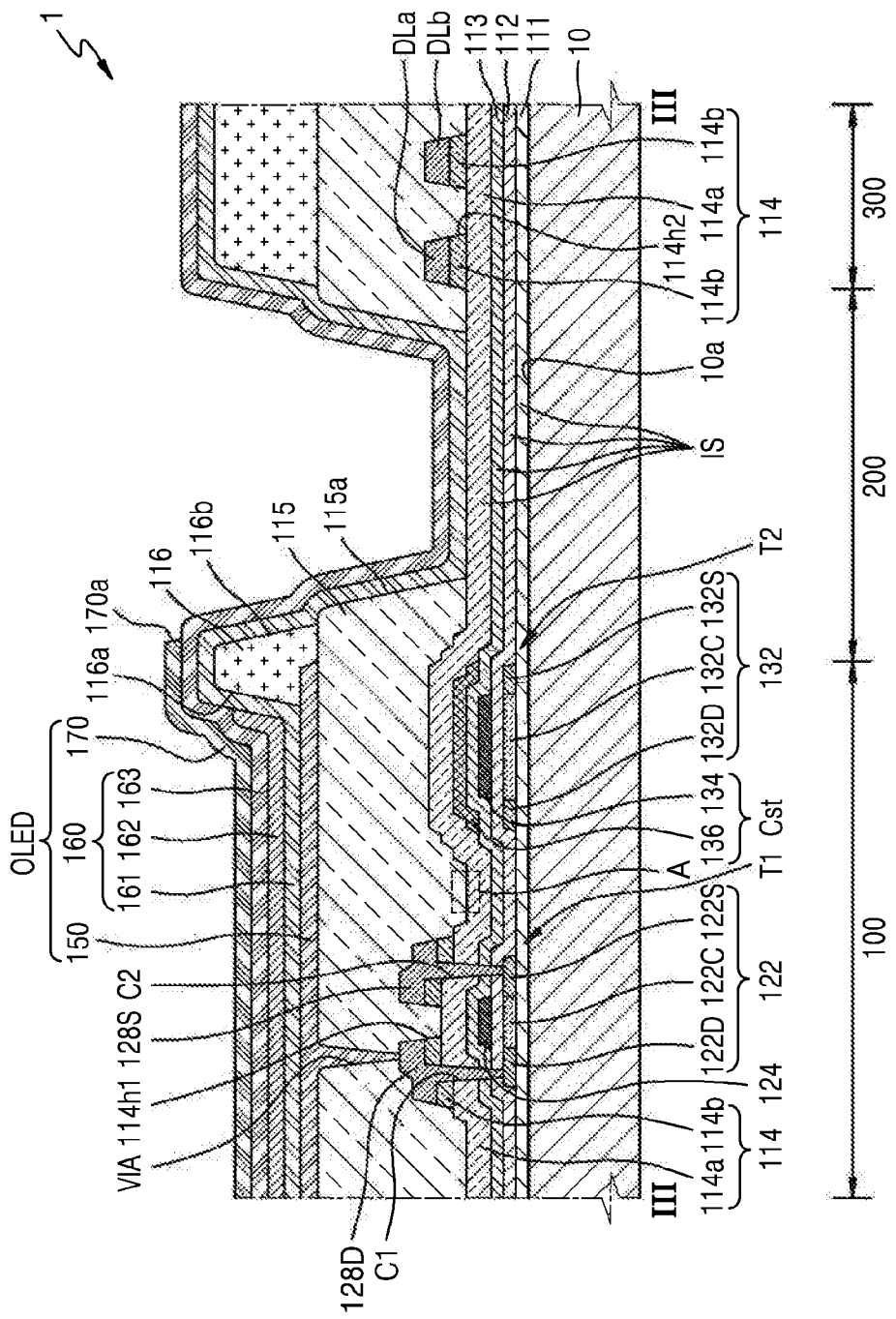
FIG. 3 is a cross-sectional view taken along line III-III of FIG. 2.

FIG. 2 is a plan view schematically illustrating a plurality of pixels included in an OLED display 1 according to an exemplary embodiment. FIG. 3 is a cross-sectional view taken along line III-III of FIG. 2.

Referring to FIGS. 2 and 3, the OLED display 1 according to an exemplary embodiment may include a substrate 10 including a main surface 10a and a pixel P1 which is disposed on the main surface 10a of the substrate 10 and includes a first region 100 realizing an image and a second region 200 through which external light is transmitted. The pixel P1 may include a first transistor T1 which includes a first active layer 122 disposed in the first region 100, a first gate electrode 124 disposed on the first active layer 122 to be insulated from the first active layer 122, and one or more electrode patterns 128D and 128S disposed on the first gate electrode 124 and electrically connected to the first active layer 122. The pixel P1 also includes a first insulation layer 114 which is disposed between the first gate electrode 124 and the electrode patterns 128D and 128S and includes a lower insulation layer 114a and an upper insulation layer 114b which is disposed on the lower insulation layer 114a to correspond to the electrode patterns 128D and 128S and has a refractive index different from that of the lower insulation layer 114a. The pixel P1 further includes a first electrode 150 which is disposed in the first region 100 to be electrically connected to the first transistor T1, a pixel defining layer 116 which is disposed in the first region 100 and includes a first opening 116a exposing a portion of the first electrode 150 and a second opening 116b corresponding to the second region 200, a second electrode 170 opposite to the first electrode 150, and an intermediate layer 160 which is disposed between the first electrode 150 and the second electrode 170 and includes an organic emission layer 162.

The pixel P1 included in the OLED display 1 may include the first region 100 emitting light having a certain color and the second region 200 through which external light is transmitted. A user may see, through the second region 200, an image outside the OLED display 1.

A first subpixel SPr, a second subpixel SPg, and a third subpixel SPb, which emit lights having different colors, may be disposed in the first region 100. The first subpixel SPr, the second subpixel SPg, and the third subpixel SPb may respectively emit red light, green light, and blue light. However, the present embodiment is not limited thereto. In other exemplary embodiments, if white light is realized by combination, arbitrary colors may be combined.

Each of first subpixel SPr, the second subpixel SPg, and the third subpixel SPb may be driven by a pixel circuit unit which includes a plurality of transistors T1 and T2 and a capacitor Cst. According to an exemplary embodiment, at least a portion of the pixel circuit unit may be disposed to overlap the first electrode 150 included in each of the first subpixel SPr, the second subpixel SPg, and the third subpixel SPb in plan view. In such a configuration, the first electrode 150 may be a reflective electrode, and the second electrode 170 may be a transparent or semitransparent electrode. Such a structure may be a structure suitable for the OLED display 1 having the top emission type. At least a portion of the pixel circuit unit may be disposed between the substrate 10 and the first electrode 150, and thus, a space occupied by the pixel circuit unit in the pixel P1 is reduced. Accordingly, an aperture ratio and a transmittance of the OLED display 1 are enhanced.

However, the present embodiment is not limited thereto, and an OLED display according to another exemplary embodiment may have a bottom emission type where a first electrode is a transparent or semitransparent electrode and a second electrode is a reflective electrode. In this case, the pixel circuit unit may be disposed not to overlap the first electrode 150 so that emitted light is not refracted and/or reflected.

The OLED display 1 according to an exemplary embodiment may include a plurality of pixels, and in FIG. 2, only two pixels which are disposed along a first direction D1. Hereinafter, the two pixels may be referred to as a first pixel P1 and a second pixel P2, respectively.

The OLED display 1 according to an exemplary embodiment may include a first pixel P1 and a second pixel P2 which are disposed along the first direction D1. The OLED display 1 may include at least one line wire disposed along the first direction D1 and at least one wire which is disposed between the first pixel P1 and the second pixel P2 and extends along a second direction D2 crossing the first direction D1.

According to an exemplary embodiment, the at least one wire extending along the first direction D1 may be a scan line SLi, and the at least one wire extending along the second direction D2 may be data lines DLa and DLc and a power line ELVDD. However, the present embodiment is not limited thereto.

The second region 200 may be a transparent region where light incident on one surface of the substrate 10 from the outside of the OLED display 1 passes through the OLED display 1 and is recognized by a user, and thus, a reflective electrode, an opaque wire, and/or the like may not be disposed in the second region 200. The second region 200 may be divided by an opaque wire or an opaque electrode. According to an exemplary embodiment, the second region 200 may be defined as a region between an opaque wire and another opaque wire spaced apart therefrom. However, the present embodiment is not limited thereto. In other exemplary embodiments, if the pixel defining layer 120 is formed of a light-absorbing material, the second region 200 may be defined as a region where the second opening 116b included in the pixel defining layer 116 is disposed.

According to an exemplary embodiment, a ratio of an area of the second opening 116b included in the pixel defining layer 116 to a total area of each of the first pixel P1 and the second pixel P2 may be about 40% to about 90%. If an area of the second opening 116b is less than about 40%, a ratio of a region which is included in the OLED display 1 and is high in external light transmittance may be lowered, and for this reason, it is difficult for the OLED display 1 to function as a transparent display apparatus. As an area of the second opening 116b is enlarged, a transmittance of the OLED display 1 may increase, but since it is required to secure the first region 100 displaying an image, an area occupied by the second opening 116b in each of the pixels P1 and P2 may not exceed about 90%.

Referring to FIG. 3, a buffer layer 111 is disposed on the substrate 10, and a first transistor T1, a second transistor T2, and the capacitor Cst are disposed in the first region 100 on the buffer layer 111. The substrate 10 may be formed of glass, plastic, and/or the like, and the buffer layer 111 may be formed of a single layer including silicon oxide ($SiO_2$). The buffer layer 111 prevents impurities from penetrating to the driving circuit unit DC from the substrate 10 and planarizes a surface, and depending on the embodiment, the buffer layer 111 may be omitted.

The first transistor T1 may include the first active layer 122 disposed on the buffer layer 111 and the first gate electrode 124 disposed on the first active layer 122. The first active layer 122 may include a channel region 122C, and a source region 122S and a drain region 122D which are spaced apart from each other with the channel region 122C therebetween.

The first active layer 122 may be formed of various materials, and according to an exemplary embodiment, the first active layer 122 may be formed of polysilicon. The source region 122S and drain region 122D of the first active layer 122 may each be formed of polysilicon with impurities doped thereon and may have conductivity due to the doping.

A lower gate insulation layer 112 may be disposed between the first active layer 122 and the first gate electrode 124, and the lower gate insulation layer 112 may extend from the first region 100 to the second region 200. According to an exemplary embodiment, the lower gate insulation layer 112 may be a single layer including $SiO_2$.

The first gate electrode 124 may be a single layer or a multi-layer formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

An upper gate insulation layer 113 covering the first gate electrode 124 may be disposed on the lower gate insulation layer 112, and the first insulation layer 114 which includes the lower insulation layer 114a and the upper insulation layer 114b having different refractive indexes may be disposed on the upper gate insulation layer 113.

The upper gate insulation layer 113 may be a single layer formed of $SiO_2$ or a double layer which includes a layer including $SiO_2$ and a layer including silicon nitride (SiNx). The lower insulation layer 114a may include a single layer including $SiO_2$, and the upper insulation layer 114b may be a single layer including silicon nitride (SiNx).

A plurality of conductive patterns 128S and 128D may be disposed on the first insulation layer 114, and the upper insulation layer 114b may be disposed between only the lower insulation layer 114a and the conductive patterns 128S and 128D. That is, the upper insulation layer 114b may not be disposed in a region where the conductive patterns 128S and 128D are not disposed.

According to an exemplary embodiment, the conductive patterns 128S and 128D may include the source electrode 128S and the drain electrode 128D which are electrically connected to the source region 122S and the drain region 122D, respectively. Therefore, the upper insulation layer 114b may be disposed under the source electrode 128S and the drain electrode 128D and may not be disposed between the source electrode 128S and the drain electrode 128D. That is, the upper insulation layer 114b may include an opening 114h1 disposed between the source electrode 128S and the drain electrode 128D.

The source electrode 128S and the drain electrode 128D may each be a single layer or a multi-layer formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). According to an exemplary embodiment, the source electrode 128S and the drain electrode 128D may each be formed of a triple layer of Ti/Al/Ti.

According to an exemplary embodiment, one of the source electrode 128S and the drain electrode 128D may be omitted.

The lower gate insulation layer 112, the upper gate insulation layer 113, and the lower insulation layer 114a and the upper insulation layer 114b included in the first insulation layer 114 may each include a plurality of contact holes C1 and C2 for connecting the conductive patterns 128S and 128D to the first active layer 122. That is, each of the contact holes C1 and C2 may be an opening which exposes a portion of the first active layer 122 because openings included in the lower gate insulation layer 112, the upper gate insulation layer 113, the lower insulation layer 114a, and the upper insulation layer 114b are connected to each other.

A via insulation layer 115 which covers the upper insulation layer 114b and the conductive patterns 128S and 128D may be disposed on the lower insulation layer 114a, and the via insulation layer 115 may include an opening 115a corresponding to the second region 200. A thickness of the via insulation layer 115 may be about 2 μm or more and may be sufficiently thickly configured, and thus, coupling of the first gate electrode 124 and/or an upper electrode 136 and the first electrode 150 which occurs in a region where the upper insulation layer 114b included in the first insulation layer 114 is not disposed is prevented. That is, a parasitic capacitor is prevented from being formed due to the first gate electrode 124 and/or the upper electrode 136 and the first electrode 150.

According to an exemplary embodiment, the first region 100 may include a region A which is adjacent to the first transistor T1 and directly contacts the lower insulation layer 114a and the via insulation layer 115. The region A may include a region between the first transistor T1 and the second transistor T2.

An OLED, which includes the first electrode 150 electrically connected to the first transistor T1 and disposed in the first region 100, the second electrode 170 opposite to the first electrode 150, and the intermediate layer 160 disposed between the first electrode 150 and the second electrode 170, may be disposed on the via insulation layer 115. That is, the via insulation layer 115 may be disposed between the first transistor T1 and the first electrode 150. The via insulation layer 115 may include a via hole VIA, and a drain electrode 119D of the first transistor T1 may be connected to the first electrode 150 through the via hole VIA.

The first electrode 150 may be configured as a reflective electrode and may include a reflective layer, including Ag, Mg, Al, Pt, Pd, Au, Ni, Nd, Ir, Cr, or a compound thereof, and a transparent or semitransparent electrode layer formed on the reflective layer. The first electrode 150 may be independently formed in an island form in each of subpixels.

The second electrode 170 may be configured as a transparent or semitransparent electrode and may include one or more materials selected from among Ag, Al, Mg, Li, Ca, Cu, LiF/Ca, LiF/Al, MgAg, and CaAg. The second electrode 170 may be formed in a thin film form having several nm to several tens nm. The second electrode 170 may be provided to be electrically connected to all pixels included in the OLED display 1.

The intermediate layer 160 including the organic emission layer 162 may be disposed between the first electrode 150 and the second electrode 170, and a common layer which is disposed in all the pixels in common may be disposed between the first electrode 150 and the organic emission layer 162 and between the organic emission layer 162 and the second electrode 170. According to an exemplary embodiment, a first common layer 161 may be disposed between the first electrode 150 and the organic emission layer 162 and may include a hole injection layer (HIL) and/or a hole transport layer (HTL). A second common layer 163 may be disposed between the second electrode 170 and the organic emission layer 162 and may include an electron injection layer (EIL) and/or an electron transport layer (ETL).

The first common layer 161 and the second common layer 163 may be disposed in the first region 100 and the second region 200. Each of the first common layer 161 and the second common layer 163 may be a layer which is formed in common in all the pixels included in the OLED display 1, and may be high in transmittance. The first common layer 161 and the second common layer 163 may be disposed in a whole region of the OLED display 1.

According to an exemplary embodiment, the second electrode 170 may include an opening 170a corresponding to the second region 200, and a transmittance of the second region 200 is improved by the opening 170a. However, the present embodiment is not limited thereto. In other exemplary embodiments, the second electrode 170 may be disposed all over the first region 100 and the second region 200.

The organic emission layer 162 may emit red light, green light, or blue light. However, the present embodiment is not limited thereto. In other exemplary embodiments, if white light is realized by combination, arbitrary colors in addition to red, green, and blue may be combined.

The OLED display 1 according to an exemplary embodiment may have a top emission type where an image is realized in a direction toward the second electrode 170, but the present embodiment is not limited thereto.

According to another exemplary embodiment, the OLED display 1 may have a bottom emission type where an image is realized in a direction toward the substrate 10. In this case, the first electrode may be a transparent or semitransparent electrode, and the second electrode may be a reflective electrode.

In addition to the first transistor T1, the second transistor T2 and the capacitor Cst may be further disposed in the first region 100 on the buffer layer 111. The second transistor T2 may be disposed on the same layer as the first active layer 122 of the first transistor T1. Also, the second transistor T2 may include the second active layer 132, including a source region 132S, a drain region 132D, and a channel region 132C, and the second gate electrode 134 which is disposed on the same layer as the first gate electrode 124 of the first transistor T1. The lower gate insulation layer 112 may be disposed between the second active layer 132 and the second gate electrode 134.

Although not shown, the drain region 132D of the second active layer 132 included in the second transistor T2 may be electrically connected to the source region 122S of the first active layer 122 included in the first transistor T1. According to an exemplary embodiment, the second transistor T2 may be a driving transistor and may be electrically connected to the first electrode 150 of the OLED via the first transistor T1.

The capacitor Cst may include two electrodes opposite to each other, and the second gate electrode 134 of the second transistor T2 may function as a lower electrode of the capacitor Cst. The upper gate insulation layer 134 covering the second gate electrode 134 may be disposed on the lower gate insulation layer 112, and the upper electrode 136 may be disposed on the upper gate insulation layer 113 to be opposite to the second gate electrode 134 and may configure the capacitor Cst along with the second gate electrode 134. The upper electrode 136 may be disposed on a layer different from a layer on which the conductive patterns 128S and 128D included in the first transistor T1 are disposed. For example, the upper electrode 136 may be disposed on a layer below the layer on which the conductive patterns 128S and 128D are disposed.

The upper electrode 136 may be a single layer or a multi-layer formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

According to an exemplary embodiment, the second transistor T2 and the capacitor Cst which occupy a broad area in the pixel circuit unit for securing a channel length may be disposed to overlap each other on a plane along a direction vertical to the main surface 10a of the substrate 10. Due to such a configuration, a high-capacity capacitor Cst is implemented, and an area occupied by the pixel circuit unit is minimized. Therefore, the OLED display 1 having a high resolution is easily implemented, and an area of the second region 200 is enlarged, thereby enhancing a transmittance.

An insulation structure IS including a plurality of insulation layers 111, 112, 113 and 114a may be disposed in the second region 200 on the substrate 10. The second region 200 may be a region through which background light outside the OLED display 1 is transmitted as-is, and opaque metal and/or the like may not be disposed in the second region 200.

The insulation layers 111, 112, 113 and 114a included in the insulation structure IS may be formed of transparent insulating materials having the substantially same refractive index. The transparent insulating materials may each be $SiO_2$.

When layers having different refractive indexes are disposed adjacent to each other, reflection and/or refraction caused by a refractive index difference occur(s) in an interface between the layers. The reflection and/or the refraction cause(s) a haze where a transmittance of light is reduced and transmitted light is blurred.

However, since the insulation layers 111, 112, 113 and 114a disposed in the second region 200 of the OLED display 1 according to an exemplary embodiment have substantially the same refractive index, reflection and/or refraction occur(s) in interfaces between the insulation layers 111, 112, 113 and 114a, and thus, a transmittance of the OLED display 1 is improved, and a haze is prevented from occurring in the OLED display 1.

The insulation layers 111, 112, 113 and 114a may be respective layers to which the buffer layer 111, the lower gate insulation layer 112, the upper gate insulation layer 113, and the lower insulation layer 114a of the first insulation layer 114 disposed in the first region 100 extend. The upper insulation layer 114b of the first insulation layer 114 may not be disposed in the second region 200. The upper insulation layer 114b may include SiNx having a refractive index higher than those of the insulation layers 111, 112, 113 and 114a. The upper insulation layer 114b formed of SiNx enhances a characteristic of each of the first and second transistors T1 and T2 in a thermal annealing process. According to an exemplary embodiment, the thermal annealing process may be performed at about 500 degrees or more.

According to an exemplary embodiment, by etching the upper insulation layer 114b along with the conductive patterns 128S and the 128D, the upper insulation layer 114b may not be disposed in the second region 200. Also, the upper insulation layer 114b may be patterned through the same mask process as a mask process of forming the conductive patterns 128S and the 128D, and thus, since a separate mask process for patterning the upper insulation layer 114b is unnecessary, a manufacturing process is simplified. This will be described below.

The OLED display 1 according to an exemplary embodiment may further include a wire region 300 which is disposed adjacent to the first region 100 and the second region 200, and the data lines DLa and DLb for respectively applying data signals to a plurality of subpixels may be disposed in the wire region 300.

The lower insulation layer 114a included in the first insulation layer 114 may extend to the wire region 300 and may be disposed under the data lines DLa and DLb, and the upper insulation layer 114b may be patterned on the lower insulation layer 114a to correspond to the data lines DLa and DLb.

The upper insulation layer 114b disposed in the third region 300 may be disposed in only a region where the data lines DLa and DLb are disposed, and may not be disposed in a region where the data lines DLa and DLb are not disposed. That is, the upper insulation layer 114b may include an opening 114h2 disposed between the data lines DLa and DLb.

The data lines DLa and DLb may be disposed on the same layer as the conductive patterns 128S and 128D and may be formed of the same material. The upper insulation layer 114b may be formed through the same mask process as a mask process of forming the conductive patterns 128S and 128D and the data lines DLa and DLb.

FIGS. 4A to 4I are cross-sectional views sequentially illustrating a method of manufacturing the OLED display of FIG. 3.

Figure 4A:
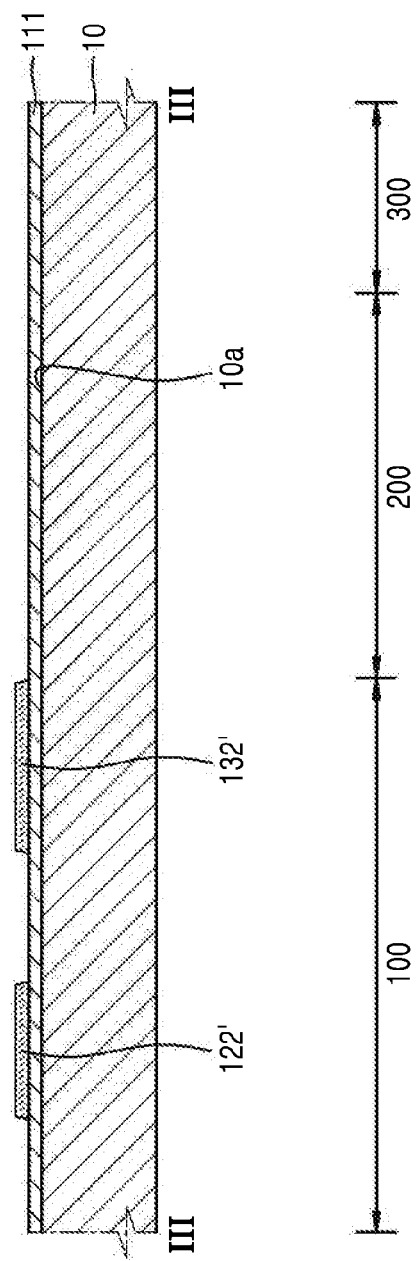
FIGS. 4A, 4B, 4C, 4D, 4E, 4F, 4G, 4H and 4I are cross-sectional views sequentially illustrating a method of manufacturing the OLED display of FIG. 3.

Referring to FIG. 4A, a substrate 10 which includes a first region 100 realizing an image and a second region 200 through which external light is transmitted may be prepared, and then, a first semiconductor pattern 122' and a second semiconductor pattern 132' may be formed in the first region 100 of the substrate 10. An operation of forming a buffer layer 111 on the substrate 10 may be further performed before the first semiconductor pattern 122' and the second semiconductor pattern 132' are formed. The buffer layer 111 may be a single layer formed of $SiO_2$.

The first semiconductor pattern 122' and the second semiconductor pattern 132' may be formed by forming and patterning a semiconductor material all over the substrate 10. According to an exemplary embodiment, the semiconductor material may be polysilicon. The polysilicon may be formed by doping amorphous silicon on the substrate 10 and irradiating a laser or the like onto the amorphous silicon to crystallize the amorphous silicon.

Figure 4B:
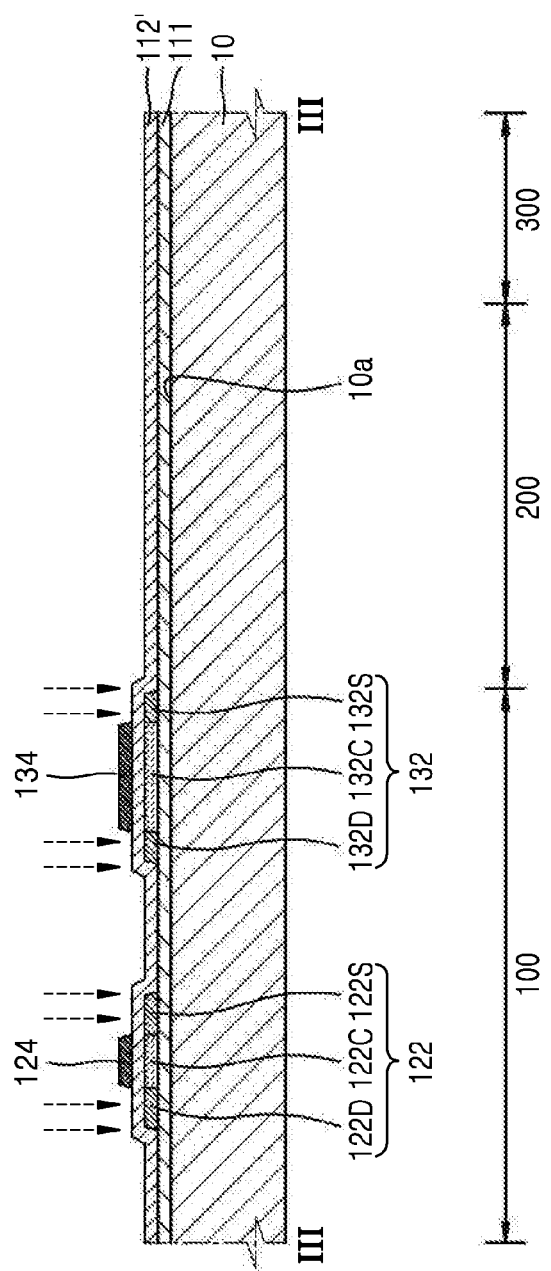

Referring to FIG. 4B, a first insulating material 112' may be formed on the substrate 10 to cover the first semiconductor pattern 122' and the second semiconductor pattern 132', and then, a first gate electrode 124 and a second gate electrode 134 may be formed on the first insulating material 112'. The first gate electrode 124 and the second gate electrode 134 may be formed by forming and patterning a conductive material.

A first active layer 122 including a source region 122S, a drain region 122D, and a channel region 122C and a second active layer 132 including a source region 132S, a drain region 132D, and a channel region 132C may be formed by doping the first semiconductor pattern 122' and the second semiconductor pattern 132' by using the first gate electrode 124 and the second gate electrode 134 as masks.

Figure 4C:
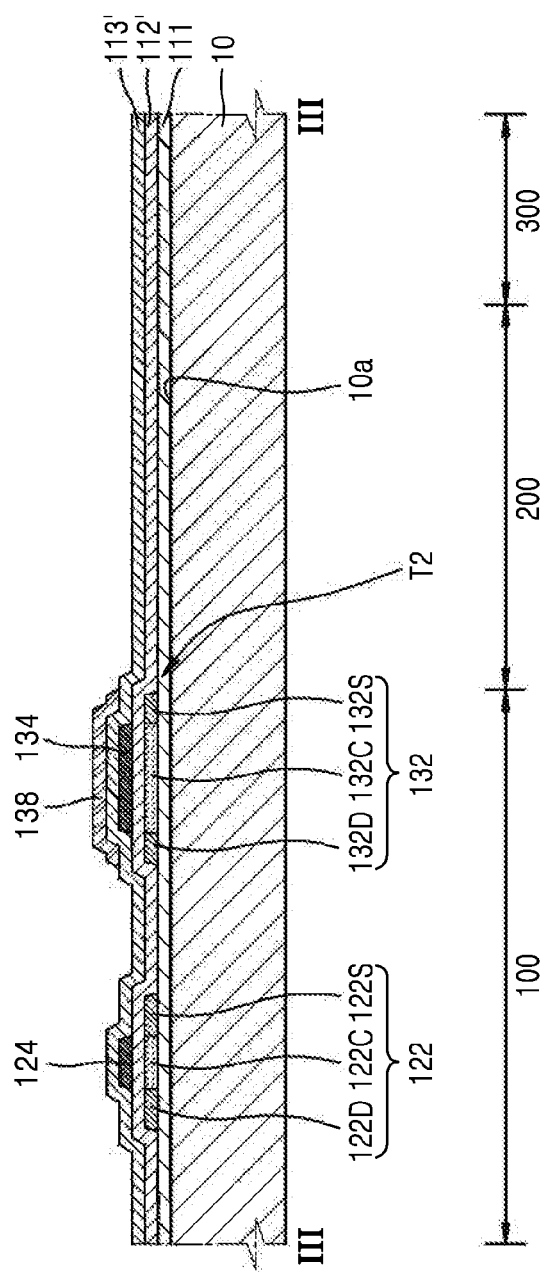

Referring to FIG. 4C, a second insulating material 113' may be formed on the first insulating material 112' to cover the first gate electrode 124 and the second gate electrode 134, and then, an upper electrode 138 may be formed on the second insulating material 113'. The upper electrode 138 may be formed by forming and patterning a conductive material.

Figure 4D:
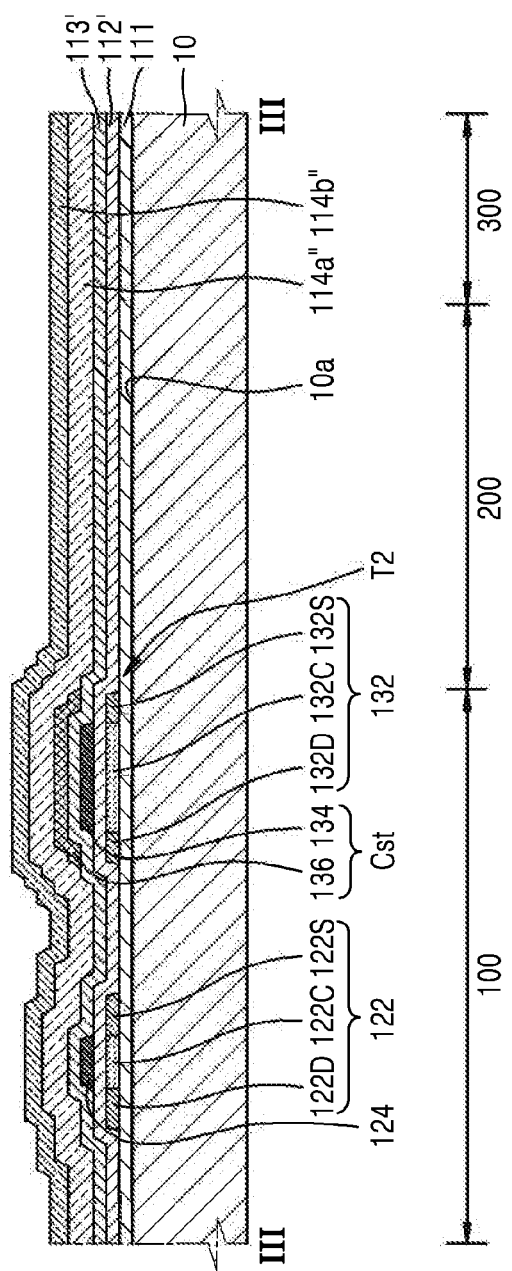

Referring to FIG. 4D, a lower insulating material 114a" and an upper insulating material 114b" may be formed on the second insulating material 113' to cover the upper electrode 138. According to an exemplary embodiment, each of the second insulating material 113' and the lower insulating material 114a" may be $SiO_2$, and the upper insulating material 114b" may be SiNx.

Figure 4E:
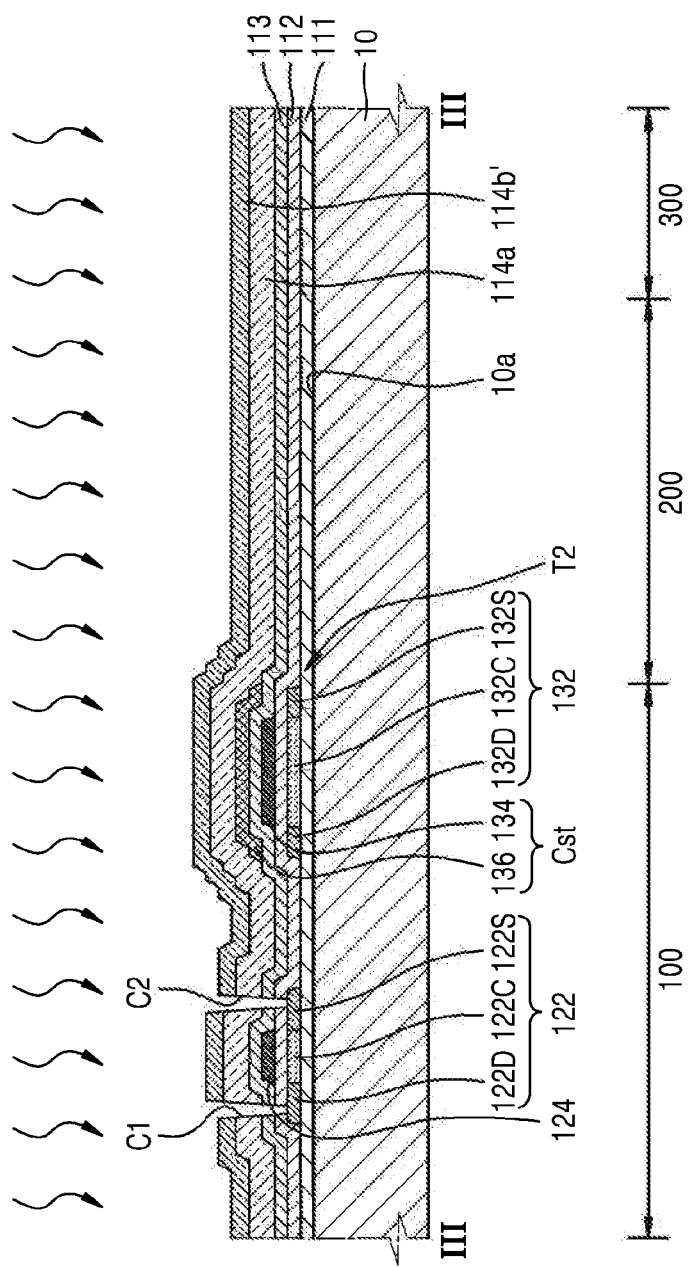

Referring to FIG. 4E, a first contact hole C1 and a second contact hole C2 which respectively expose the source region 122S and drain region 122D of the first active layer 122 may be formed by simultaneously patterning the first insulating material 112', the second insulating material 113', the lower insulating material 114a", and the upper insulating material 114b". The first insulating material 112', the second insulating material 113', and the lower insulating material 114a" may be the lower gate insulation layer 112, the upper gate insulation layer 113, and the lower insulation layer 114a of the first insulation layer 114 illustrated in FIG. 3, respectively. The upper insulating material 114b" may be an upper insulation layer 114b' which includes an opening for forming the contact holes C1 and C2.

The first contact hole C1 and the second contact hole C2 may be formed, and then, a rapid thermal annealing (RTA) process may be formed for enhancing a characteristic of each of the first and second transistors T1 and T2. Hydrogen included in the upper insulation layer 114b' including SiNx penetrates into the first active layer 122 of the first transistor T1 and the second active layer 132 of the second transistor T2 due to the RTA process, and the penetrated hydrogen may again connect a portion where a hydrogen bonding of polysilicon configuring the first and second active layers 122 and 132 is broken. Due to the connection, a transfer characteristic of the channel region 122C included in the first active layer 122 and a transfer characteristic of the channel region 132C included in the second active layer 132 are improved, and thus, a characteristic of each of the first and second transistors T1 and T2 is improved.

In terms of a characteristic of a material, a content of hydrogen included in silicon nitride may be far higher than that of silicon oxide. Therefore, in order to enhance a characteristic of each of the first and second transistors T1 and T2, the upper insulation layer 114b' including silicon nitride may be formed, and then, the thermal annealing process may be performed for the upper insulation layer 114b'.

Figure 4F:
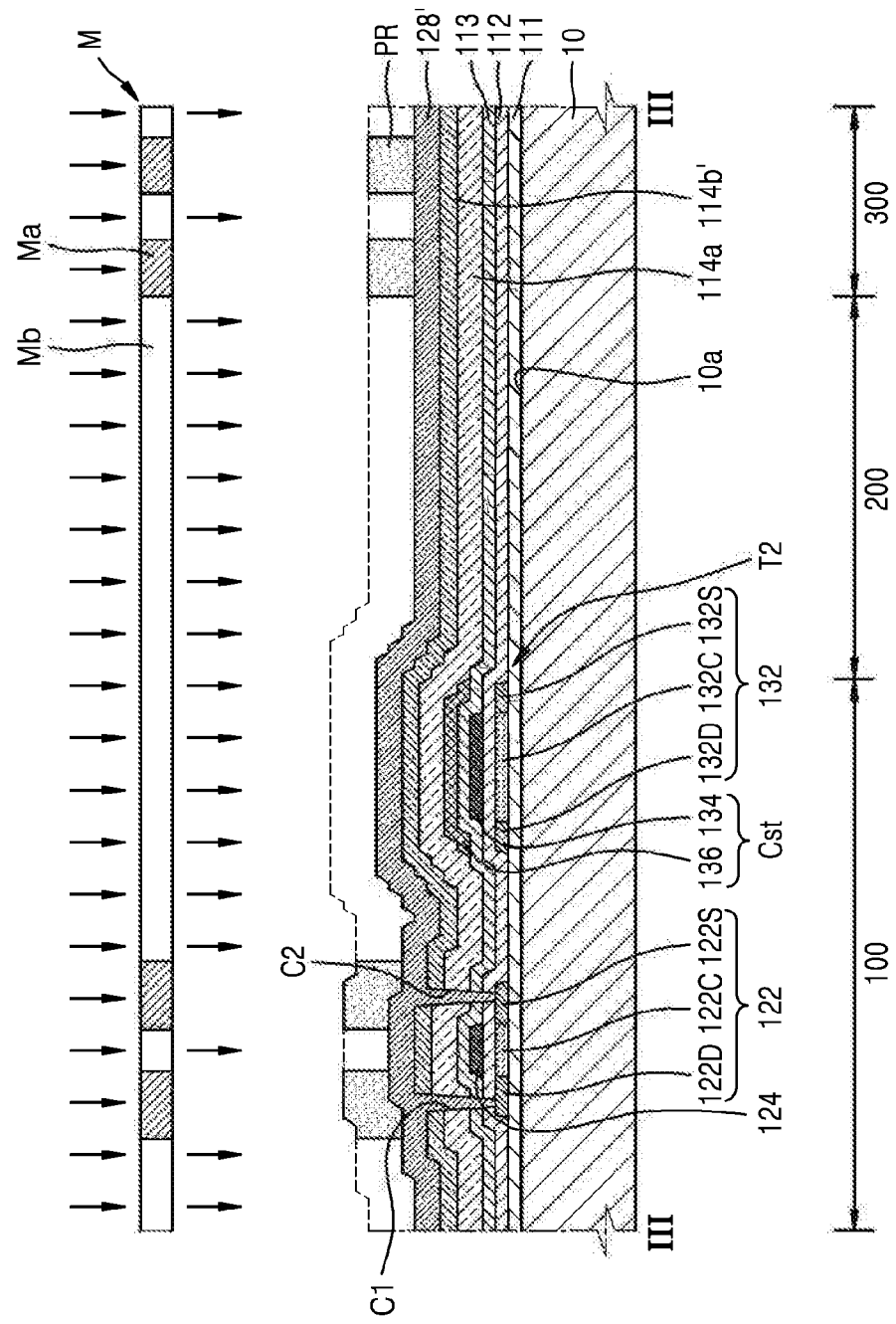

Referring to FIG. 4F, a conductive material 128' and a photoresist PR may be formed on the upper insulation layer 114b' where the contact holes C1 and C2 are formed. According to an exemplary embodiment, the conductive material 128' may be formed of a triple layer of Ti/Al/Ti.

After the photoresist PR is formed, light may be irradiated onto the photoresist PR by using a mask M which includes a light blocking part Ma blocking the light and a light transmitting part Mb transmitting the light, and then, the photoresist PR in a region onto which the light is irradiated may be developed. In FIG. 4F, a case where the photoresist PR is positive is illustrated, but the present embodiment is not limited thereto. In other exemplary embodiments, the photoresist PR may be negative, and in this case, a position of the light blocking part Ma of the mask M may be opposite to a position of the light transmitting part Mb.

The conductive material 128' in a region corresponding to the light transmitting part Mb may be exposed by developing the photoresist PR.

Figure 4G:
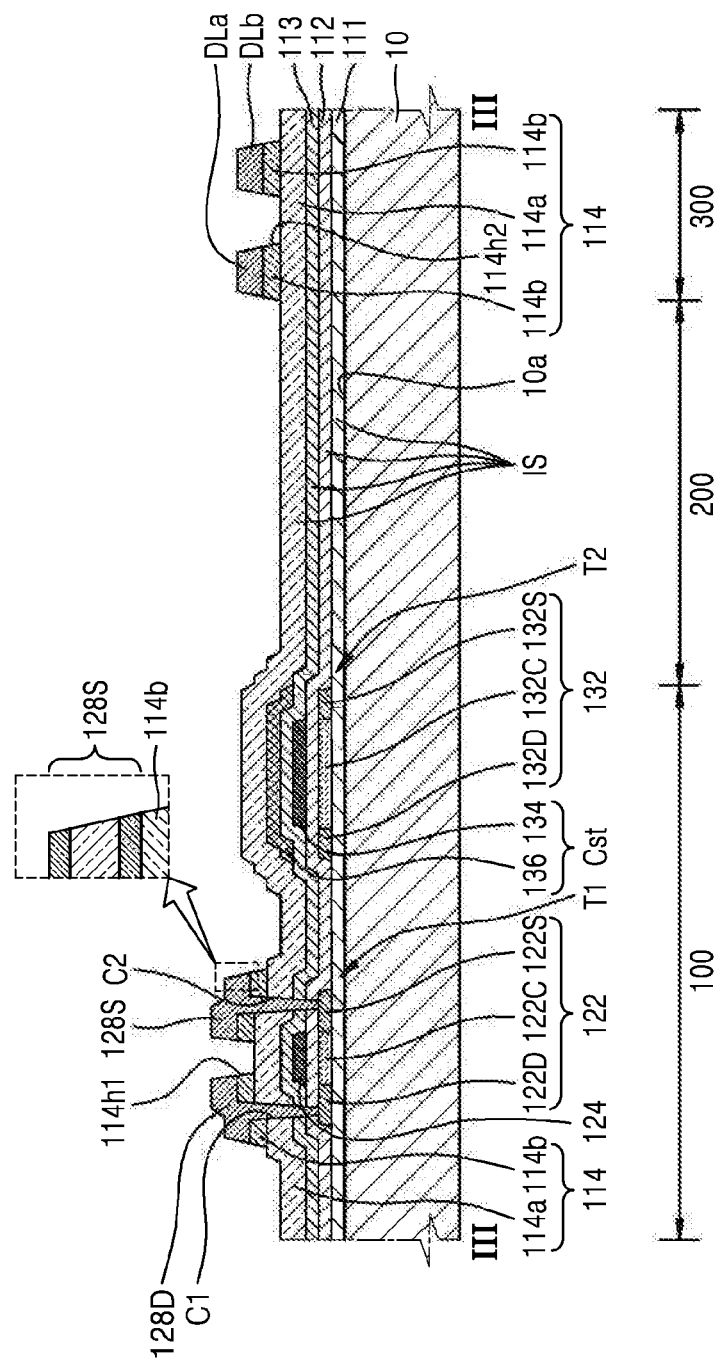

Referring to FIG. 4G, the conductive material 128' exposed by the photoresist PR and the upper insulation layer 114b' disposed under the conductive material 128' may be simultaneously etched. According to an exemplary embodiment, the etching may be dry etching, an etch gas may use a gas where a chlorine (Cl$_2$) gas is mixed with a boron trichloride (BCl$_3$) gas. In the etching process, the conductive material 128' and the upper insulation layer 114b' disposed thereunder may be etched by adjusting an etch time in the etching process.

According to an exemplary embodiment, the conductive material 128' may be formed of a triple layer which includes Ti of about 300 Å, Al of about 5,000 Å, and Ti of about 700 Å, and the upper insulation layer 114b' may be silicon nitride of about 2,000 Å. An etch time for removing the conductive material 128' and the upper insulation layer 114b' may be about 170 seconds or more.

A plurality of conductive patterns 128S and 128D, connected to the active layer 122 through the contact holes C1 and C2, and an upper insulation layer 114b disposed between the lower insulation layer 114a and the conductive patterns 128S and 128D may be formed through the etching process.

The conductive patterns 128S and 128D may respectively be a source electrode 128S and a drain electrode 128D which are respectively connected to the source region 122S and drain region 122D of the active layer 122. The upper insulation layer 114b may include an opening 114h1 disposed between the source electrode 128S and the drain electrode 128D.

Moreover, a plurality of data lines DLa and DLb and the upper insulation layer 114b disposed between the lower insulation layer 114a and the data lines DLa and DLb may be formed in a wire region 300 through the etching process. The upper insulation layer 114b may include an opening 114h2 disposed between the data lines DLa and DLb.

An insulation structure IS including a plurality of insulation layers 111, 112, 113 and 114a may be disposed in the second region 200 on the substrate 10. Since the insulation layers 111, 112, 113 and 114a have substantially the same refractive index, reflection and/or refraction occur(s) in an interface between layers having different refractive indexes.

Figure 4H:
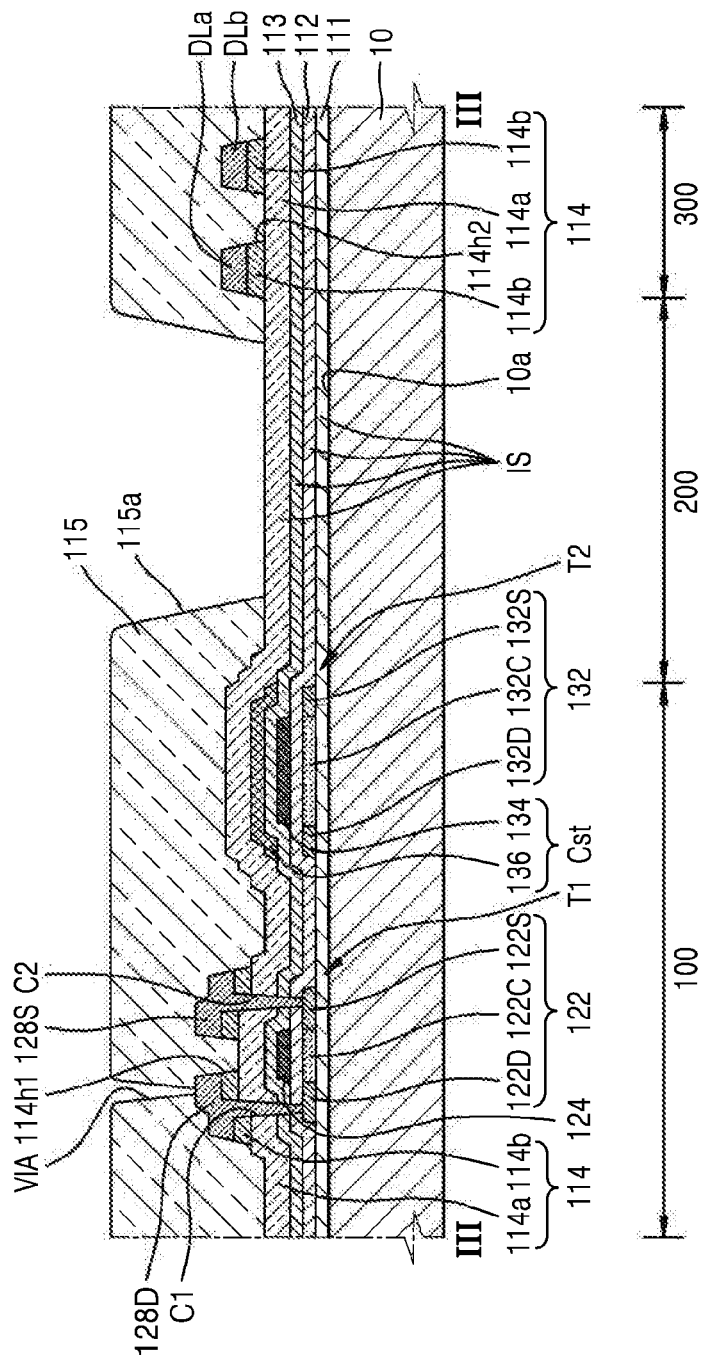
Figure 4I:
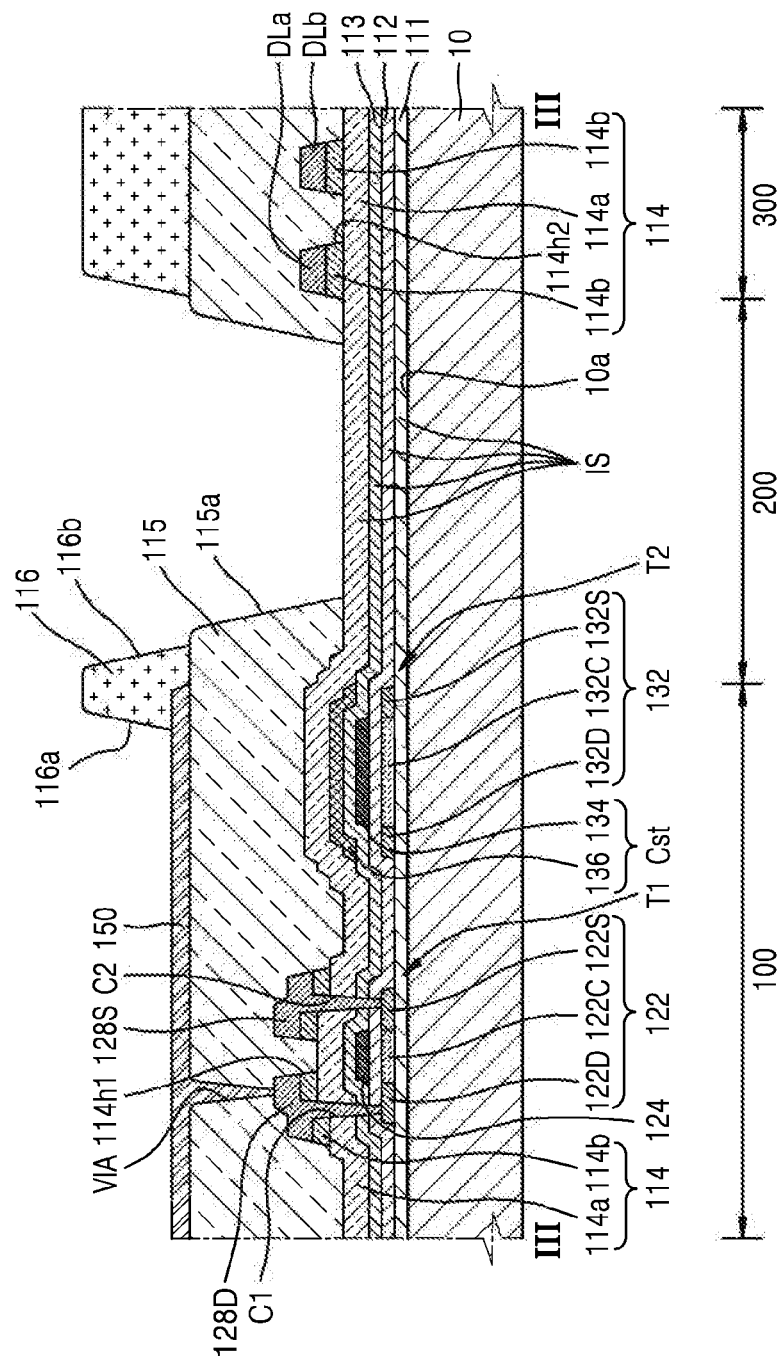

Referring to FIGS. 4H, 4I, and 3, an insulating material may be formed on a result material of FIG. 4G, and then, a via hole VIA and a via insulation layer 115 including an opening 115a corresponding to the second region 200 may be formed by patterning the insulating material. The insulating material may be an organic material, but is not limited thereto.

A first electrode 150 which is connected to the first transistor T1 through the via hole VIA may be formed in the first region 100 on the via insulation layer 115, and then, a pixel defining layer 116 which includes a first opening 116a exposing a portion of the first electrode 150 and an opening 116b corresponding to the second region 200 may be formed by forming and patterning an insulating material on the first electrode 150.

An intermediate layer 160, including an organic emission layer 162, and a second electrode 170 may be formed on the first electrode 150 exposed by the first opening 116a. Before the organic emission layer 162 is formed, a first common layer 161 may be formed on the first electrode 150, and after the organic emission layer 162 is formed, a second common layer 163 may be formed. Here, the first common layer 161 and the second common layer 162 may be disposed to extend to the second region 200.

The second electrode 170 may include an opening 170a corresponding to the second region 200, but is not limited thereto. An operation of forming the opening 170a may be omitted.

Figure 5:
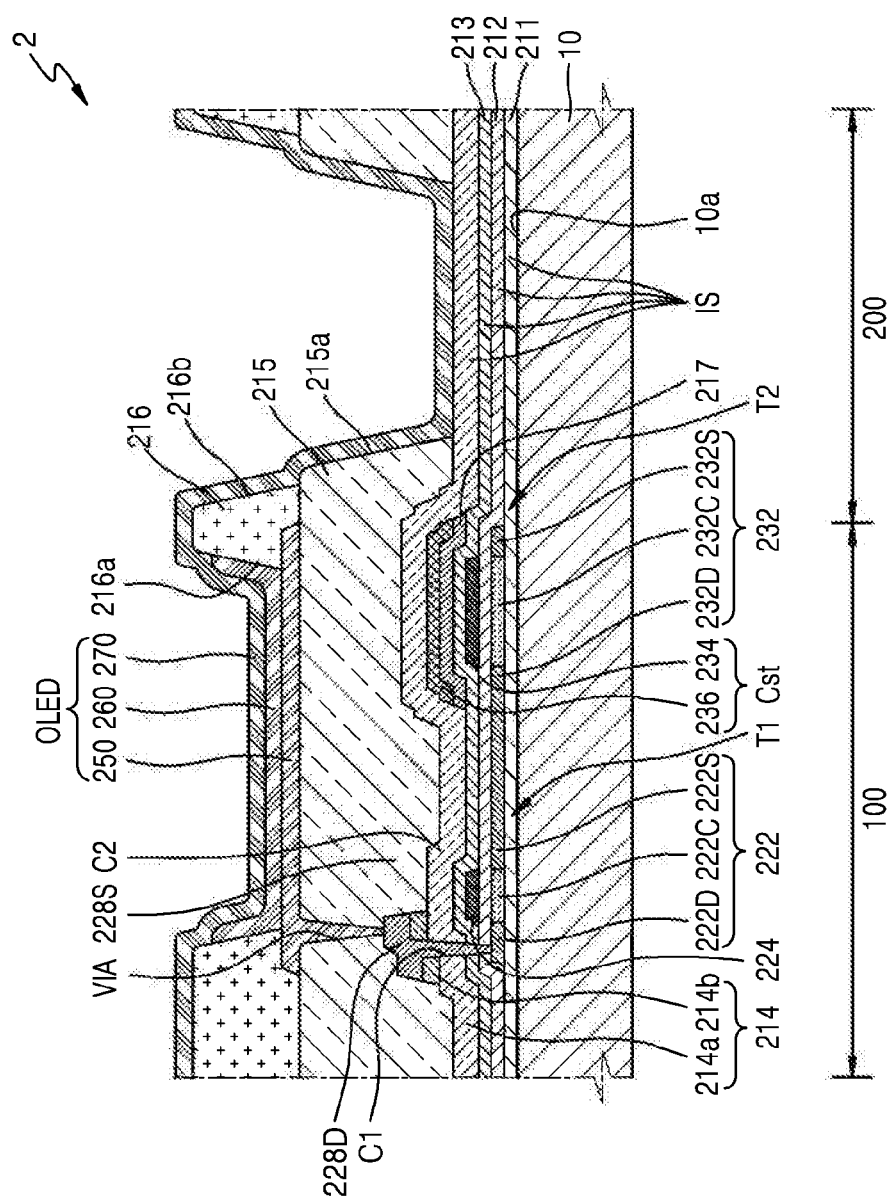
FIG. 5 is a cross-sectional view schematically illustrating an OLED display according to another exemplary embodiment.

FIG. 5 is a cross-sectional view schematically illustrating an OLED display 2 according to another exemplary embodiment.

Referring to FIG. 5, the OLED display 2 according to another exemplary embodiment may include a substrate 10 including a main surface 10a and a pixel which is disposed on the main surface 10a of the substrate 10 and includes a first region 100 realizing an image and a second region 200 through which external light is transmitted. The pixel may include a first transistor T1 which includes a first active layer 222 disposed in the first region 100, a first gate electrode 224 disposed on the first active layer 222 to be insulated from the first active layer 222, and one or more electrode patterns 128D and 128S disposed on the first gate electrode 224 and electrically connected to the first active layer 222. The pixel also includes a first insulation layer 214 which is disposed between the first gate electrode 224 and the electrode pattern 228D and includes a lower insulation layer 214a and an upper insulation layer 214b which is disposed on the lower insulation layer 214a to correspond to the electrode pattern 228D and has a refractive index different from that of the lower insulation layer 214a. The pixel further includes a first electrode 250 which is disposed in the first region 100 to be electrically connected to the first transistor T1, a pixel defining layer 216 which is at least disposed in the first region 100 and includes a first opening 216a exposing a portion of the first electrode 250 and a second opening 216b corresponding to the second region 200, a second electrode 270 opposite to the first electrode 250, and an intermediate layer 260 which is disposed between the first electrode 250 and the second electrode 270 and includes an organic emission layer 260.

A buffer layer 211 may be disposed on the substrate 10, and a first transistor T1, a second transistor T2, and the capacitor Cst may be disposed in the first region 100 on the buffer layer 211.

The first transistor T1 may include the first active layer 222 disposed on the buffer layer 211 and the first gate electrode 224 disposed on the first active layer 222. The first active layer 222 may include a channel region 222C, and a source region 222S and a drain region 222D which are spaced apart from each other with the channel region 222C therebetween.

A lower gate insulation layer 212 may be disposed between the first active layer 222 and the first gate electrode 224, and the lower gate insulation layer 212 may extend from the first region 100 to the second region 200. According to an exemplary embodiment, the lower gate insulation layer 212 may be a single layer including $SiO_2$.

An upper gate insulation layer 213 covering the first gate electrode 224 may be disposed on the lower gate insulation layer 212, and the first insulation layer 214 which includes the lower insulation layer 214a and the upper insulation layer 214b having different refractive indexes may be disposed on the upper gate insulation layer 213.

The upper gate insulation layer 213 may be a single layer including $SiO_2$. The lower insulation layer 214a may include a single layer including $SiO_2$, and the upper insulation layer 214b may be a single layer including SiNx.

A conductive pattern 228D may be disposed on the first insulation layer 214, and the upper insulation layer 214b may be disposed between only the lower insulation layer 214a and the conductive pattern 228D. That is, the upper insulation layer 214b may not be disposed in a region where the conductive pattern 228D are not disposed.

The lower gate insulation layer 212, the upper gate insulation layer 213, and the lower insulation layer 214a and the upper insulation layer 214b included in the first insulation layer 214 may each include a contact hole C1 for connecting the conductive pattern 228D to the first active layer 222.

A via insulation layer 215 which covers the upper insulation layer 214b and the conductive pattern 228D may be disposed on the lower insulation layer 214a, and the via insulation layer 215 may include an opening 215a corresponding to the second region 200.

An OLED, which includes the first electrode 250 electrically connected to the first transistor T1 and disposed in the first region 100, the second electrode 270 opposite to the first electrode 250, and the intermediate layer 260 disposed between the first electrode 250 and the second electrode 270, may be disposed on the via insulation layer 215. According to an exemplary embodiment, the intermediate layer 260 may include an organic emission layer, and although not shown, the intermediate layer 260 may further include a common layer as illustrated in FIG. 3.

According to an exemplary embodiment, the second electrode 270 may be disposed in the first region 100 and the second region 200. The second electrode 270 may be a transparent or semitransparent electrode, and even when the second electrode 270 is disposed in the second region 200, external background light may pass through the OLED display 2 through the second region 200. The second electrode 270 may be formed all over the substrate 10 without a process of forming an opening corresponding to the second region 200.

In addition to the first transistor T1, the second transistor T2 and the capacitor Cst may be further disposed in the first region 100 on the buffer layer 211. The second transistor T2 may be disposed on the same layer as the first active layer 222 of the first transistor T1. Also, the second transistor T2 may include the second active layer 232, including a source region 232S, a drain region 232D, and a channel region 232C, and the second gate electrode 234 which is disposed on the same layer as the first gate electrode 224 of the first transistor T1. The lower gate insulation layer 212 may be disposed between the second active layer 232 and the second gate electrode 234. The drain region 232D of the second active layer 232 may be connected to the source region 222S of the first active layer 222.

The second gate electrode 234 may function as a lower electrode of the capacitor Cst as well as a gate electrode of the second transistor T2, and the capacitor Cst may include the second gate electrode 234 and an upper electrode 236 which is disposed opposite to the second gate electrode 234.

The upper gate insulation layer 213 and a second insulation layer 217 may be disposed between the second gate electrode 234 and the upper electrode 236. The upper gate insulation layer 213 may include $SiO_2$, and the second insulation layer 217 may include SiNx. The second insulation layer 217 may be patterned to be disposed under only the upper electrode 236. That is, the second insulation layer 217 may not be disposed in a region where the upper electrode 236 is not disposed.

Although not shown, the upper electrode 236 and the second insulation layer 217 may be formed by the substantially same method as a method of simultaneously forming the upper insulation layer 114b and the conductive patterns 128S and 128D illustrated in FIGS. 4F and 4G.

An area of the upper electrode 236 may be larger than that of the second gate electrode 234. In this case, the second insulation layer 217 may fully cover the second insulation layer 217. According to another exemplary embodiment, the upper gate insulation layer 213 may be omitted, and in this case, the second insulation layer 217 may fully cover the second gate electrode 234, whereby short circuit does not occur between the second gate electrode 234 and the upper electrode 236.

The upper gate insulation layer 113 and the second insulation layer 217 may each function as a dielectric layer of the capacitor Cst. SiNx having a refractive index higher than that of $SiO_2$ may be disposed between the second gate electrode 234 and the upper electrode 236, and thus, a capacity of the capacitor Cst increases. When the second insulation layer 217 is disposed in another region such as the second region 200 or the like, reflection and/or refraction occur(s) in an interface between adjacent layers formed of $SiO_2$. According to an exemplary embodiment, however, since the second insulation layer 217 is disposed under only the upper electrode 236, reflection and/or refraction do(s) not occur in the interface.

An insulation structure IS including a plurality of insulation layers 211, 212, 213 and 214a may be disposed in the second region 200 on the substrate 10. The insulation layers 211, 212, 213 and 214a included in the insulation structure IS may be formed of transparent insulating materials having substantially the same refractive index. The transparent insulating materials may each be $SiO_2$.

Since the insulation layers 211, 212, 213 and 214a disposed in the second region 200 of the OLED display 2 according to an exemplary embodiment have substantially the same refractive index, reflection and/or refraction occur(s) in interfaces between the insulation layers 211, 212, 213 and 214a, and thus, a transmittance of the OLED display 2 is improved, and a haze is prevented from occurring in the OLED display 2.

The insulation layers 211, 212, 213 and 214a may be respective layers to which the buffer layer 211, the lower gate insulation layer 212, the upper gate insulation layer 213, and the lower insulation layer 214a of the first insulation layer 214 disposed in the first region 100 extend. The upper insulation layer 214b of the first insulation layer 214 and the second insulation layer 217 which are formed of SiNx may not be disposed in the second region 200.

According to an exemplary embodiment, the upper insulation layer 214b may be etched along with the conductive pattern 228D, and the second insulation layer 217 may be etched along with the upper electrode 236. Therefore, a separate mask process may not be added, and the upper insulation layer 214b and the second insulation layer 217 may not be disposed in the second region 200.

In the OLED display 1 (2) according to exemplary embodiments, the upper insulation layer 114b (214b) may not be disposed in the second region 200 through which external light is transmitted, and thus, reflection and/or refraction do(s) not occur between layers having different refractive indexes. That is, a transmittance of the OLED display 1 (2) is improved, and a haze is prevented from occurring in the OLED display 1 (2).

Moreover, the upper insulation layer 214b (114b) and the conductive pattern(s) 228D (128S and 128D) may be simultaneously formed by the same align mask process, and thus, the OLED display 1 (2) with enhanced transmittance may be manufactured without a mask being added.

According to at least one of the disclosed embodiments, an OLED display can prevent a transmittance from being reduced due to layers having different refractive indexes and thus has an enhanced transmittance.

Moreover, an OLED manufacturing process is simplified without a mask being added.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the drawings, it will be understood by those of ordinary skill in the art that various changes in form and details may be made therein without departing from the spirit and scope as defined by the following claims.

What is claimed is:

1. An organic light-emitting diode (OLED) display, comprising:
   a substrate; and
   a pixel disposed over the substrate, the pixel including a first region configured to generate an image and a second region configured to transmit external light, wherein the pixel comprises:
      a first transistor including a first active layer disposed in the first region, a first gate electrode disposed over the first active layer and insulated from the first active layer, and at least one electrode pattern disposed over the first gate electrode and electrically connected to the first active layer;
      a first insulation layer disposed between the first gate electrode and the electrode pattern, the first insulation layer including a lower insulation layer and an upper insulation layer disposed over the lower insulation layer, wherein the upper insulation layer corresponds to the at least one electrode pattern and has a refractive index different from a refractive index of the lower insulation layer;
      a first electrode disposed in the first region and electrically connected to the first transistor;
      a pixel defining layer disposed in the first region and having a first opening connected to a portion of the first electrode and a second opening corresponding to the second region;
      a second electrode opposite to the first electrode; and
      an intermediate layer disposed between the first and second electrodes, wherein the intermediate layer includes an organic emission layer.

2. The OLED display of claim 1, wherein the first active layer comprises a source region, a drain region spaced apart from the source region, and a channel region disposed between the source region and the drain region, wherein the at least one conductive pattern comprises a source electrode and a drain electrode electrically connected to the source region and the drain region, respectively, and spaced apart from each other, and wherein the upper insulation layer comprises an opening corresponding to a region between the source and drain electrodes.

3. The OLED display of claim 1, further comprising a via insulation layer disposed between the first transistor and the first electrode, the via insulation layer including an opening corresponding to the second region.

4. The OLED display of claim 3, wherein the first region comprises a region that is adjacent to the first transistor and directly contacts the lower insulation layer and the via insulation layer.

5. The OLED display of claim 1, wherein the at least one conductive pattern comprises a titanium (Ti) layer, an aluminum (Al) layer, and a Ti layer which are sequentially arranged.

6. The OLED display of claim 1, further comprising a data line disposed adjacent to the second region, wherein the lower insulation layer extends to a bottom portion of the data line, and wherein the upper insulation layer is disposed on the lower insulation layer and corresponds to the data line.

7. The OLED display of claim 6, wherein the data line includes a plurality of data lines, wherein the data lines are disposed adjacent to one another, and wherein the upper insulation layer comprises an opening disposed between the data lines.

8. The OLED display of claim 1, wherein the lower insulation layer is formed of silicon oxide, and wherein the upper insulation layer is formed of silicon nitride.

9. The OLED display of claim 1, further comprising:
   a second transistor electrically connected to the first transistor; and
   a capacitor electrically connected to the second transistor and overlapping the second transistor in the depth dimension of the OLED display,
   wherein the second transistor comprises a second active layer and a second gate electrode insulated from the second active layer, wherein the capacitor comprises i) the second gate electrode configured to function as a lower electrode and ii) an upper electrode opposite the second gate electrode, and wherein the upper electrode and the at least one conductive pattern are disposed on different layers.

10. The OLED display of claim 9, further comprising a second insulation layer disposed between the second gate electrode and the upper electrode and corresponding to the upper electrode.

11. The OLED display of claim 10, wherein the upper electrode is larger in area than the second gate electrode.

12. The OLED display of claim 10, wherein the second insulation layer is formed of silicon nitride.

13. The OLED display of claim 1, further comprising an insulation structure disposed in the second region on the substrate, wherein the insulation structure includes a plurality of insulation layers, and wherein the insulation layers are formed of insulating materials having substantially the same refractive index.

* * * * *